United States Patent
Li et al.

(10) Patent No.: US 7,634,371 B2
(45) Date of Patent: Dec. 15, 2009

(54) SYSTEM AND METHOD FOR ANALYZING JITTER OF SIGNALS

(75) Inventors: Cheng-Shien Li, Tu-Cheng (TW); Shou-Kuo Hsu, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 698 days.

(21) Appl. No.: 11/212,338

(22) Filed: Aug. 26, 2005

(65) Prior Publication Data

US 2006/0045226 A1    Mar. 2, 2006

(30) Foreign Application Priority Data

Aug. 27, 2004    (CN) .................... 2004 1 0051295

(51) Int. Cl.
G01R 13/00    (2006.01)
H04B 3/46    (2006.01)
(52) U.S. Cl. ........................ 702/69; 375/226
(58) Field of Classification Search ............ 702/66–73, 702/75–76; 375/226, 371; 324/76.12, 76.52, 324/76.77
See application file for complete search history.

(56) References Cited

U.S. PATENT DOCUMENTS

| | | | | |
|---|---|---|---|---|
| 5,402,443 | A * | 3/1995 | Wong | 375/226 |
| 5,557,196 | A * | 9/1996 | Ujiie | 324/76.77 |
| 6,137,283 | A * | 10/2000 | Williams et al. | 324/76.12 |
| 6,167,359 | A * | 12/2000 | Demir et al. | 702/191 |
| 6,298,315 | B1 | 10/2001 | Li et al. | 702/180 |
| 6,356,850 | B1 * | 3/2002 | Wilstrup et al. | 702/69 |
| 6,529,842 | B1 * | 3/2003 | Williams et al. | 702/66 |
| 6,598,004 | B1 * | 7/2003 | Ishida et al. | 702/69 |
| 6,651,016 | B1 * | 11/2003 | Shaw et al. | 702/69 |
| 6,832,172 | B2 * | 12/2004 | Ward et al. | 702/69 |
| 6,839,391 | B2 * | 1/2005 | Novak et al. | 375/354 |
| 7,035,325 | B2 * | 4/2006 | Kleck et al. | 375/226 |
| 2006/0080054 | A1 * | 4/2006 | Li et al. | 702/69 |

OTHER PUBLICATIONS

Stephens, R., Analyzing Jitter At High Data Rates, Feb. 2004, IEEE Optical Communications, pp. S6-S10.*

* cited by examiner

*Primary Examiner*—Michael P. Nghiem
*Assistant Examiner*—Toan M Le
(74) *Attorney, Agent, or Firm*—Raymond J. Chew

(57) ABSTRACT

The present invention provides a system and a method for analyzing jitter of various signals including measurement signals and simulation signals. The method includes the steps of: (a) obtaining a signal file; (b) identifying a type of the signal file; (c) defining a jitter analysis mode from a phase jitter mode, a periodic jitter mode and a cycle jitter mode; (d) obtaining an n-bit differential signal from the signal file; (e) rebuilding an ideal clock based on the differential signal by means of performing a Minimum Deviation Algorithm (MDA); (f) calculating and analyzing jitter of the differential signal according to the ideal clock by means of performing the MDA; and (g) generating and outputting a jitter analysis wave and jitter analysis results according to the defined jitter analysis mode.

17 Claims, 7 Drawing Sheets

SYSTEM AND METHOD FOR ANALYZING JITTER OF SIGNALS

BACKGROUND OF THE INVENTION

1. Field of the Invention

The present invention relates to systems and methods for analyzing signals, and more particularly to a system and method for analyzing jitter of signals.

2. General Background

Jitter in serial data communication is a difference of data transition times relative to ideal bit clock active transition times. Jitter represents a deviation, typically in picoseconds, from the ideal. As data transfer rates increase within semiconductor devices and other high speed applications increase, the jitter component may become more significant. For example, in video graphics chips, jitter can cause a flicker or jumping of the video image. Also, in serial data communication systems jitter will cause errors. In order to understand the effects that jitter may have on semiconductor devices and data communication systems, measurements of jitter and other aspects of timing are critical during the prototyping stages and production tests.

Jitter has four major components which include inter-symbol interference, cycle jitter, periodic jitter, and random jitter. The inter-symbol interference is caused by a data path propagation delay that is a function of past data history and occurs in all finite bandwidth data paths. The cycle jitter is caused by different propagation delays for positive and negative data transitions. The periodic jitter is caused by one or more sine waves and its/their harmonics. The random jitter is assumed to be Gaussian and has a power spectral density that is a function of frequency. The inter-symbol interference, cycle jitter and periodic jitter are all bounded, and they may be described as a peak or peaks to peaks value in bit period, unit interval (UI) or seconds. In contrast, the random jitter is unbounded, and it may be described by a standard deviation in UIs or seconds.

As semiconductor devices and data communication systems development, analyzing the jitter components is valuable to the product designers and testers. For example, measuring the periodic jitter helps determine whether there is cross-talk on a circuit. Analyzing the inter-symbol interference and the cycle jitter permits the cause of the bit error rate to be determined.

However, present available measurement instruments do not separate the jitter components. For example, oscilloscopes show jitter as an overall distribution without a separation of the random jitter and the periodic jitter. Although spectrum analyzers may measure jitter, they typically cannot be used on data streams. Further, when a spectrum analyzer measures a jitter value it does not separate the periodic jitter and the random jitter. Moreover, the present available spectrum analyzers are typically used to analyzing measurement signals, and are not used to analyzing simulation signals in a type of document. Also, formats of the measurement signals and the simulation signals are not compatible.

What is needed, therefore, is an extensive and compatible computer system for analyzing jitter of various signals, which can be compatible for the measurement signals and the simulation signals, and which can output various comparable analysis waves and analysis results.

Similarly, what is also needed is an extensive and compatible method for analyzing jitter of various signals, which can be compatible for the measurement signals and the simulation signals, and which can output various comparable analysis waves and analysis results.

SUMMARY

A computer system for analyzing jitter of signals in accordance with a preferred embodiment includes a jitter analyzing unit, a storage and a display unit. The jitter analyzing unit is used for analyzing jitter of various signals, and outputting various comparable analysis waves and analysis results. The storage is used for storing signal files and source codes of applications executable by the jitter analyzing unit. The display unit is used for displaying the jitter analysis waves and the jitter analysis results.

The jitter analyzing unit includes a file identifying module, a mode defining module, a clock rebuilding module, a jitter analyzing module, and a wave generating module. The file identifying module is used for obtaining a signal file from the storage, and identifying a type of the signal file. The mode defining module is used for defining a jitter analysis mode, the jitter analysis mode being any one of a phase jitter mode, a periodic jitter mode and a cycle jitter mode. The clock rebuilding module is used for obtaining an n-bit differential signal from the signal file, and rebuilding an ideal clock based on the differential signal. The jitter analyzing module is used for calculating and analyzing jitter of the signal file according to the ideal clock and the defined analysis mode. The wave generating module is used for generating a jitter analysis wave according to the defined jitter analysis mode, and outputting the jitter analysis wave and the jitter analysis results to the display unit.

Another preferred embodiment provides a method for analyzing jitter of signals by utilizing the above system. The method includes the steps: (a) obtaining a signal file; (b) identifying a type of the signal file; (c) defining a jitter analysis mode from a phase jitter mode, a periodic jitter mode and a cycle jitter mode; (d) obtaining an n-bit differential signal from the signal file; (e) rebuilding an ideal clock according to the differential signal by means of performing a Minimum Deviation Algorithm (MDA); (f) calculating and analyzing jitter of the differential signal according to the ideal clock by means of performing the MDA; and (g) generating and outputting a jitter analysis wave and the jitter analysis results according to the defined jitter analysis mode.

The step (f) includes the steps: selecting a window-width by means of utilizing the MDA; calculating a phase and period of the ideal clock by means of utilizing the MDA; and analyzing the jitter of the differential signal according to the phase and period of the ideal clock. The MDA is a clock recovery algorithm which meets the following formulas: $\phi = \text{median}(X), X = \{X_1, X_2, \ldots X_n\}, X_i = S_i - T_i$, and $$\min \sum_{i=1}^{i=n} |S_i - \phi - T_i|.$$

Wherein: "$X_i$" represents the time difference between the time value which the voltage of the differential signal is zero and the nearest positive edge of the ideal clock; "$S_i$" represents the time value which the voltage of the differential signal is zero; "$T_i$" represents the time value of zero voltage at the nearest positive edge of the ideal clock; and "median(x)" is a median function for calculating a median of the setting function $X = \{X_1, X_2, \ldots X_n\}$.

In summary, the system and method can analyze jitter of various signals, which can be compatible for measurement signals and simulation signals, and output various comparable analysis wave and analysis results.

DETAILED DESCRIPTION OF THE EMBODIMENTS

Figure 1:
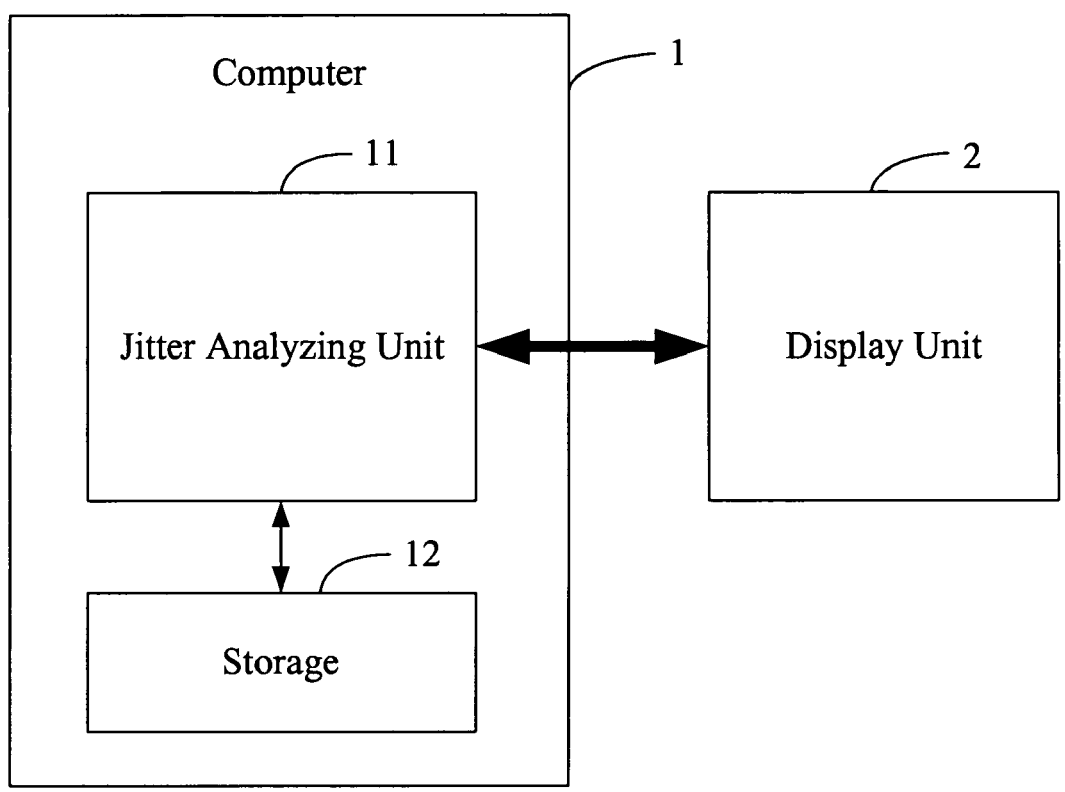
FIG. 1 is a schematic diagram of a computer system for analyzing jitter of signals according to a preferred embodiment of the present invention.

FIG. 1 is a schematic diagram of a computer system for analyzing jitter of signals (hereinafter, "the system") according to a preferred embodiment of the present invention. The system includes a computer 1 and a display unit 2. The computer 1 includes a jitter analyzing unit 11 and a storage 12. The jitter analyzing unit 11 is used for obtaining signal files, identifying a type of each signal file, defining various jitter analysis modes, rebuilding an ideal clock for a jitter analysis according to a signal file, calculating and analyzing jitter of the signal file based on the ideal clock, generating jitter analysis waves according to a predefined jitter analysis mode, and outputting the jitter analysis waves to the display unit 2 for displaying. Wherein, each signal file may be a type of signal measurement result file depicted as *.csv, or a signal simulation result file depicted as *.tr or *.cur. The jitter analysis waves constitute a graph of jitter analysis result, which can be presented by an eye-diagram, a bathtub curve, a histogram, a time domain jitter, or a frequency domain jitter. The storage 12 is used for storing the signal files and source codes of applications executable by the jitter analyzing unit 11.

Figure 2:
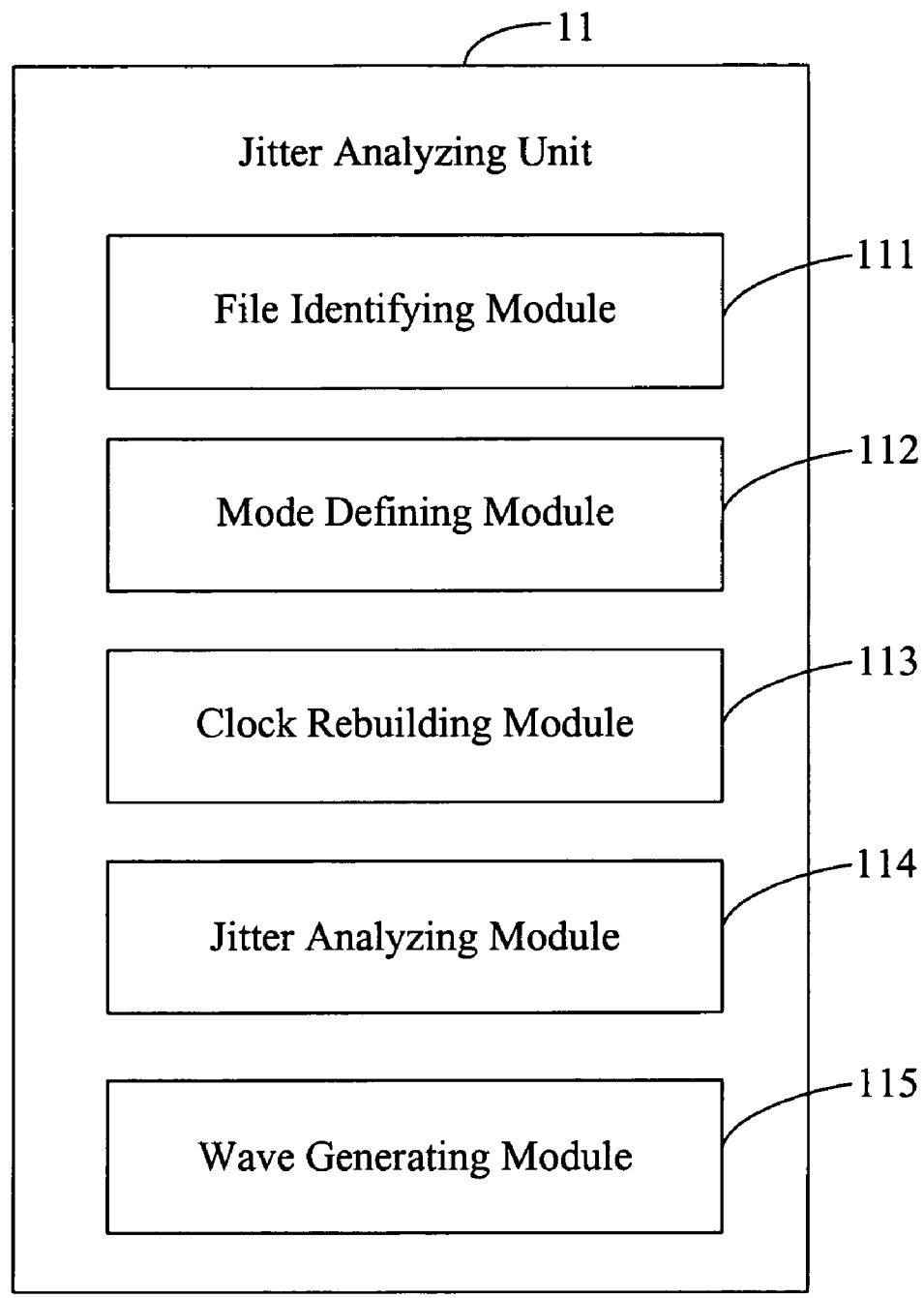
FIG. 2 is a diagram showing function modules of the jitter analyzing unit of FIG. 1.

FIG. 2 is a diagram showing function modules of the jitter analyzing unit 11. The jitter analyzing unit 11 includes a file identifying module 111, a mode defining module 112, a clock rebuilding module 113, a jitter analyzing module 114, and a wave generating module 115. The file identifying module 111 is used for obtaining a signal file from the storage 12, and identifying a type of the signal file. The mode defining module 112 is used for defining a jitter analysis mode from different jitter analysis modes, and identifying corresponding mode analysis parameters of the different analysis modes. The jitter analysis modes typically include a phase jitter mode, a periodic jitter mode and a cycle jitter mode. The clock rebuilding module 113 is used for obtaining an n-bit differential signal from the signal file, and rebuilding an ideal clock based on the differential signal. The jitter analyzing module 114 is used for calculating and analyzing jitter of the signal file according to the ideal clock. The wave generating module 115 is used for generating a jitter analysis wave according to the predefined jitter analysis mode and the jitter analysis results, and outputting the jitter analysis wave to the display unit 2.

Figure 3:
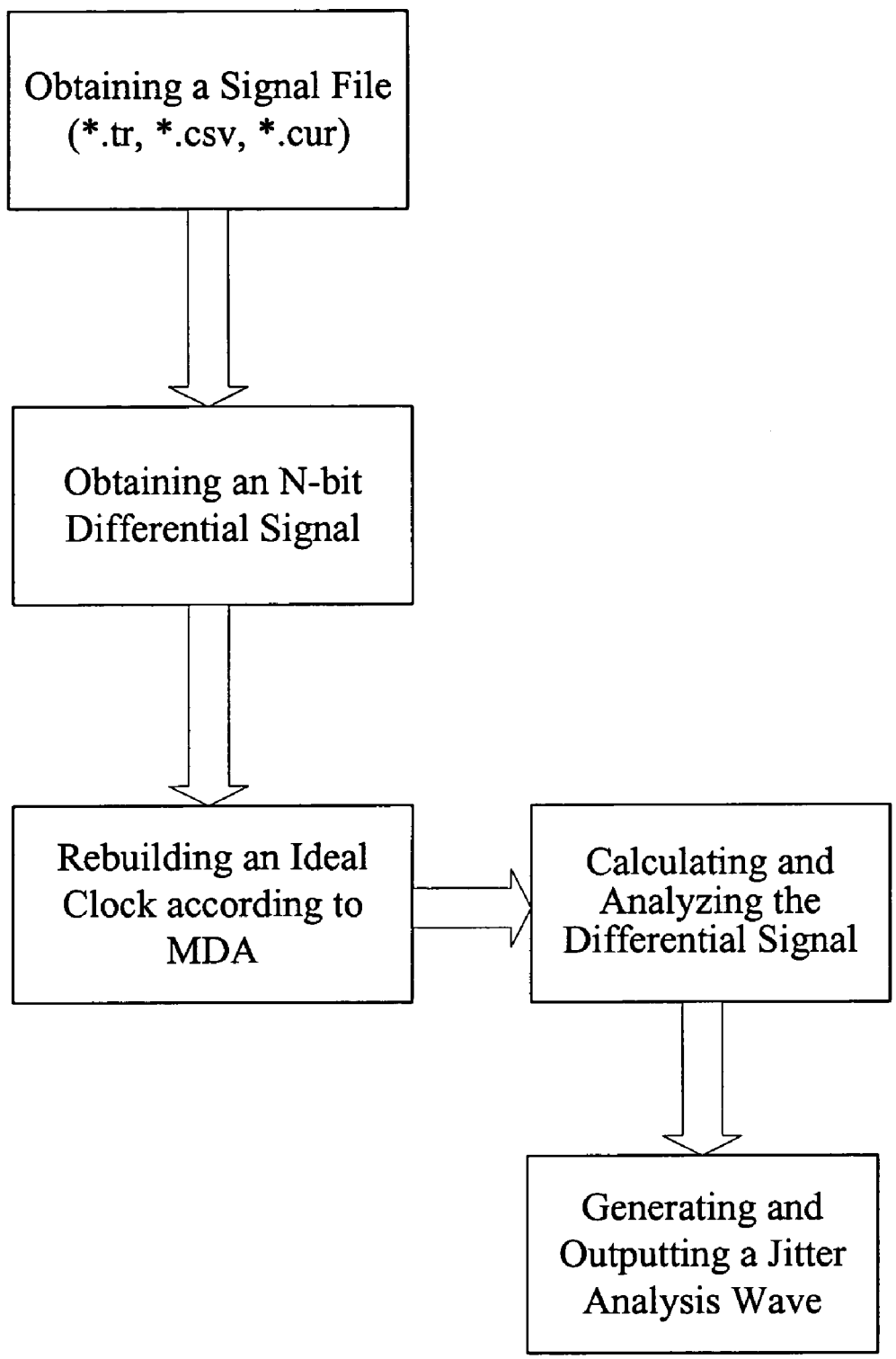
FIG. 3 illustrates main signal interchanges between various modules of the jitter analyzing unit of FIG. 2.

FIG. 3 illustrates main signal interchanges between various modules of the jitter analyzing unit 11. The file identifying module 111 obtains a signal file from the storage 12, and identifies a type of the signal file, which may be a signal measurement result file or a signal simulation result file. The clock rebuilding module 113 obtains an n-bit differential signal from the signal file, and rebuilds an ideal clock based on the differential signal by means of utilizing a minimum deviation algorithm (MDA), which is a clock recovery algorithm. The jitter analyzing module 114 calculates and analyzes jitter of the signal file according to the ideal clock also by means of utilizing the MDA. The wave generating module 115 generates a jitter analysis wave according to the jitter analysis results, and outputs the jitter analysis wave to the display unit 2.

Figure 4:
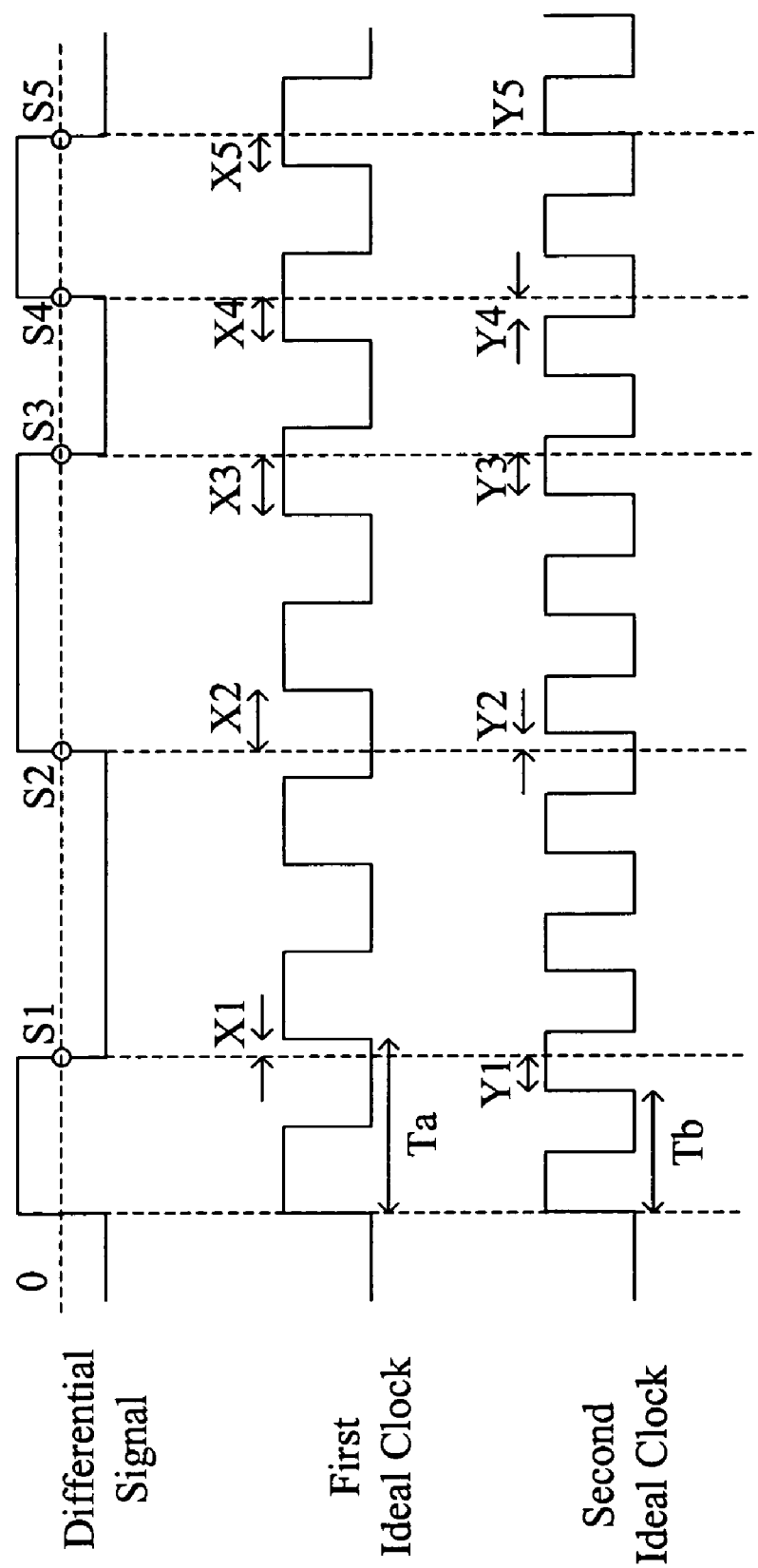
FIG. 4 is a schematic diagram of rebuilding different ideal clocks based on a differential signal by means of utilizing a minimum deviation algorithm.

FIG. 4 is a schematic diagram of rebuilding different ideal clocks based on a differential signal by means of utilizing the MDA. The clock rebuilding module 113 obtains an n-bit differential signal from a signal file to be analyzed, and rebuilds the ideal clocks. The period of the ideal clock should meet the following formulas: $\phi=\text{median}(X)$, $X=\{X_1, X_2, \ldots, X_n\}$ $X_i=S_i-T_i$, and $$\min \sum_{i=1}^{i=n} |S_i - \phi - T_i|.$$

Wherein: "$X_i$" represents the time difference between the time value which the voltage of the differential signal is zero and the nearest positive edge of the ideal clock; "$S_i$" represents the time value which the voltage of the differential signal is zero; "$T_i$" represents the time point of zero voltage at the nearest positive edge of the ideal clock; and "median(X)" is a median function for calculating a median of the setting function $X=\{X_1, X_2, \ldots X_n\}$. In the preferred embodiment of the present invention, the time values which the voltage of the differential signal is zero are symbolically depicted as S1, S2, S3, S4, and S5. In order to rebuild a first ideal clock based on the differential signal, for example, the jitter analyzing module 114 calculates a proper period of the first ideal clock, which meets the formulas: $X_1=S_1-T_1$, $T_1=Ta$; $X_2=S_2-T_2$, $T_2=3Ta$; $X_3=S_3-T_3$, $T_3=4Ta$; $X_4=S_4-T_4$, $T_4=5Ta$; and $X_5=S_5-T_5$, $T_5=6Ta$; wherein "$X_1$," "$X_2$," . . . , and "$X_n$" respectively represent the time difference between the time value which the voltage of the differential signal is zero and the nearest positive edge of the first ideal clock; and "Ta" represents the period of the first ideal clock. Then, the clock rebuilding module 113 rebuilds the first ideal clock according to the period "Ta." Similarly, in order to rebuild a second ideal clock based on the differential signal, the jitter analyzing module 114 calculates a proper period of the second ideal clock which meets the formulas: $Y_1=S_1-T_1$, $T_1=Tb$; $Y_2=S_2-T_2$, $T_2=4Tb$; $Y_3=S_3-T_3$, $T_3=6Tb$; $Y_4=S_4-T_4$, $T_4=8Tb$; and $Y_5=S_5-T_5$, $T_5=9Tb$; wherein "$Y_1$," "$Y_2$," . . . , and "$Y_n$" respectively represent the time difference between the time value which the voltage of the differential signal is zero and the nearest positive edge of the second ideal clock; and "Tb" represents the period of the second ideal clock. Then, the clock rebuilding module 113 rebuilds the second ideal clock according to the period "Tb."

Figure 5A:
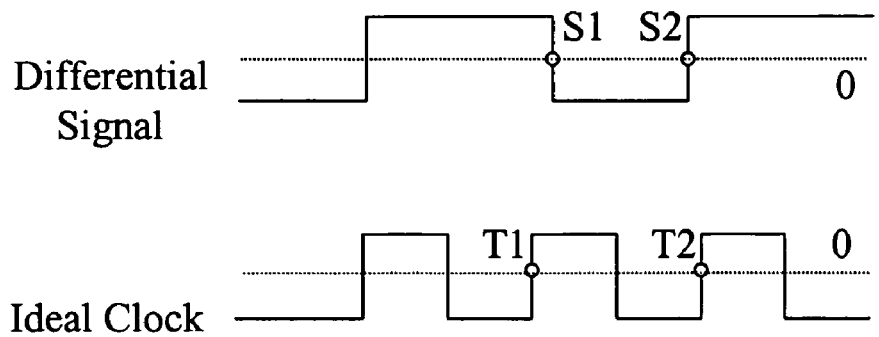
FIG. 5A-5C are schematic diagrams of three jitter analysis modes related to an ideal clock.
Figure 5B:
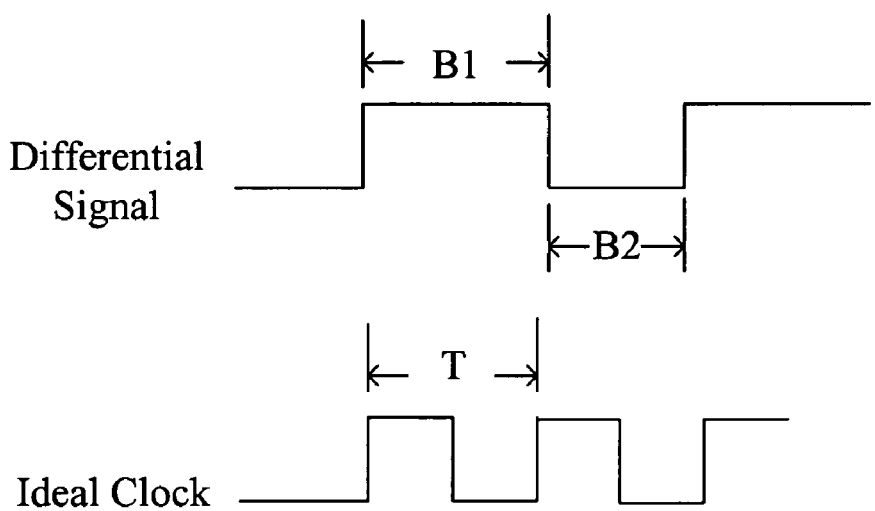
Figure 5C:
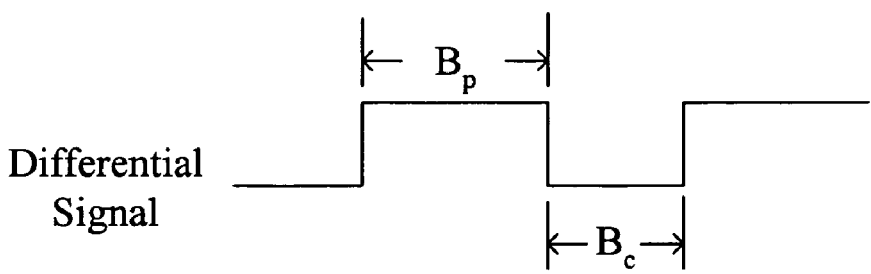

FIG. 5A-5C are schematic diagrams of three jitter analysis modes related to an ideal clock. In the preferred embodiment of the present invention, the jitter analyzing unit 11 provides three jitter analysis modes for analyzing signals, which include a phase jitter mode, a periodic jitter mode, and a cycle jitter mode. FIG. 5A is a schematic diagram of a phase jitter mode which is for analyzing jitter based on time values of zero voltage of the differential signal according to time values of zero voltage at positive edge of the ideal clock. "S1" and "S2" respectively represent the time value which the voltage of the differential signal is zero. "T1" and "T2" respectively represent time values of zero voltage at positive edge of the ideal clock. FIG. 5B is a schematic diagram of a periodic jitter mode which is for analyzing jitter based on a bit-width of the differential signal according to a period of the ideal clock. The bit-width is a time difference between two adjacent time which the-voltage of the differential signal is zero. "B$_1$" and "B$_2$" respectively represent the bit-width of the differential signal. "T" represents the period of the ideal clock. FIG. 5C is a schematic diagram of a cycle jitter mode which is for analyzing jitter based on a bit-width of current data of the differential signal according to a bit-width of previous data of the differential signal. "B$_p$" represents the bit-width of the previous data of the differential signal, and "B$_c$" represents the bit-width of the current data of the differential signal.

Figure 6:
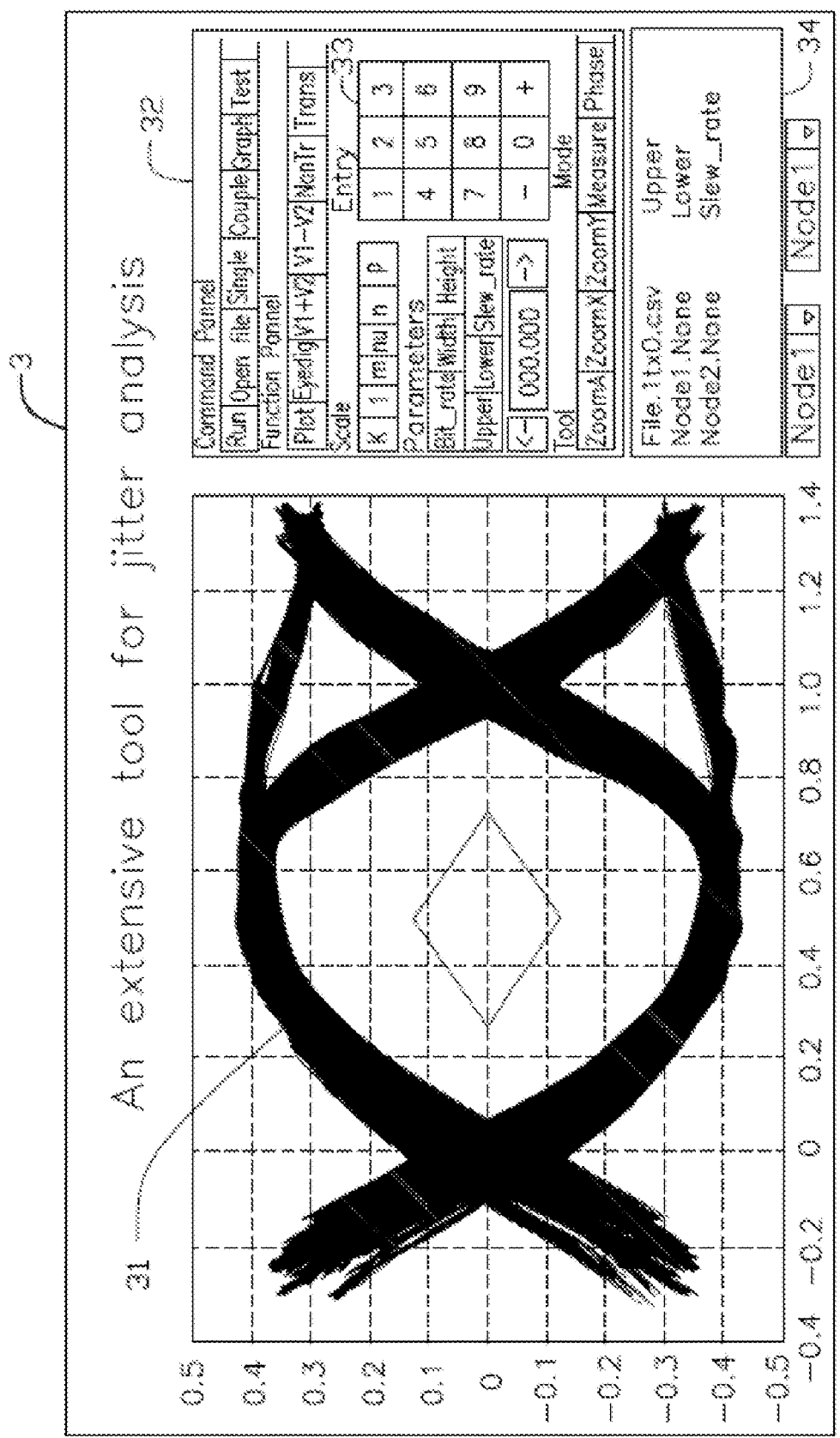
FIG. 6 is a jitter analysis interface for analyzing jitter of signals.

FIG. 6 is a jitter analysis interface for analyzing jitter of signals by utilizing the system. The jitter analysis interface 3 includes a wave displaying area 31, a command controlling area 32, a jitter analysis mode defining area 33, and a parameters setting and displaying area 34. The wave displaying area 31 is used for displaying a jitter analysis wave. The jitter analysis wave is a graph analysis result of the jitter, which may be an eye-diagram, a bathtub curve, a histogram, a time domain jitter, or a frequency domain jitter. The command controlling area 32 is used for users to select a signal file to be analyzed, and to control the process of the jitter analysis. The jitter analysis mode defining area 33 is used for the users to define a jitter analysis mode and set corresponding mode analysis parameters. The jitter analysis mode may be any one of a phase jitter mode, a periodic jitter mode and a cycle jitter mode. The mode analysis parameters typically include a frequency, a period, a phase and a bit-width of the signal. The parameters displaying area 34 is used for displaying the set parameters of the jitter analysis mode.

Figure 7:
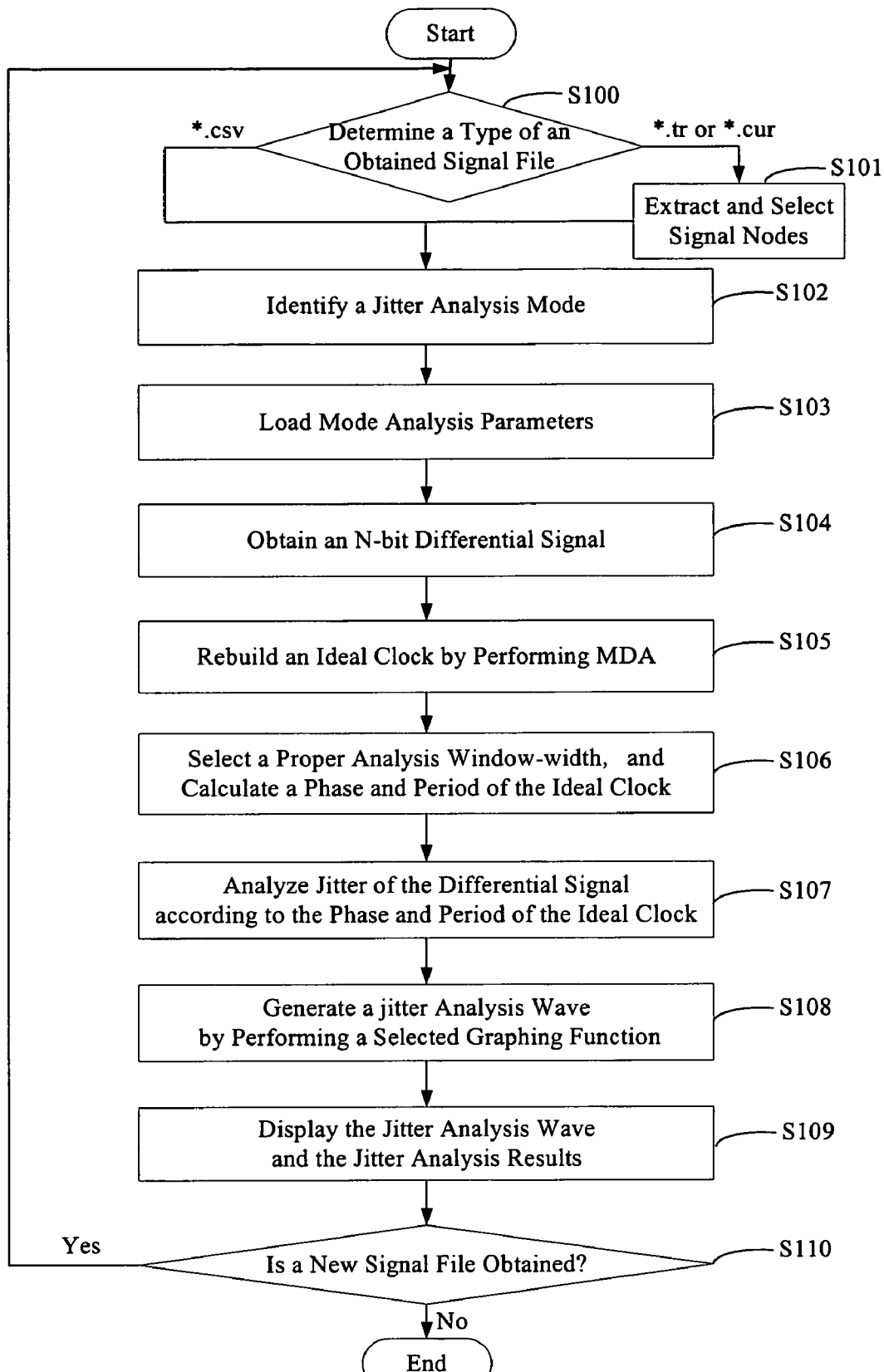
FIG. 7 is a flowchart of a preferred method for analyzing jitter of signals by implementing the system of FIG. 1.

FIG. 7 is a flowchart of a preferred method for analyzing jitter of signals by implementing the system. In step S100, the file identifying module 111 obtains a signal file from the storage 12, and determines a type of the obtained signal file. If the signal file is a signal measurement result file whose file format is *.csv, the procedure goes directly to step S102 described below. Otherwise, if the signal file is a signal simulation result file whose file format is *.tr or *.cur, in step S101, the file identifying module 111 extracts and selects signal nodes of the obtained signal file. In the signal simulation result file, any connection between two components is a signal node which respectively stores a signal voltage value. In step S102, the mode defining module 112 identifies a jitter analysis mode for the signal file, which may be a phase jitter mode, a periodic jitter mode, or a cycle jitter mode. In step S103, the mode defining module 112 loads corresponding mode analysis parameters, which may include a frequency, a period, a phase, and a bit-width of the signal. In step S104, the clock rebuilding module 113 obtains an n-bit differential signal from the signal file. In step S105, the clock rebuilding module 113 rebuilds an ideal clock based on the differential signal by means of utilizing the MDA. In step S106, the MDA automatically selects a proper analysis widow-width, and calculates a phase and period of the ideal clock according to the selected widow-width, wherein the MDA is a clock algorithm which musts meet the formula: φ=median(X),X={X$_1$, X$_2$, . . . X$_n$},X$_1$=S$_i$-T$_i$ and $$\min \sum_{i=1}^{i=n} |S_i - \phi - T_i|.$$

In step S107, the jitter analyzing module 114 calculates and analyzes the differential signal according to the phase and period of the ideal clock by means of utilizing the MDA described above in relation to FIG. 4. In step S108, the wave generating module 115 generates an analysis wave of the signal by performing a selected graphic function, wherein the analysis wave may be an eye-diagram, a bathtub curve, a histogram, a time domain jitter, or a frequency domain jitter. In step S109, the wave generating module 115 outputs the analysis wave to the display unit 2. In step S110, the jitter analyzing unit 11 determines whether a new signal file is obtained. If a new signal file is obtained, the procedure returns to the step S100 described above. If no new signal file is obtained, the procedure is finished.

Although the present invention has been specifically described on the basis of a preferred embodiment and preferred method, the invention is not to be construed as being limited thereto. Various changes or modifications may be made to the embodiment and method without departing from the scope and spirit of the invention.

We claim:

1. A computer system for analyzing jitter of signals, comprising:

a jitter analyzing unit for obtaining a signal file, identifying a type of the signal file, defining a jitter analysis mode, obtaining a differential signal from the signal file, rebuilding an ideal clock according to the differential signal by means of performing a Minimum Deviation Algorithm (MDA), calculating and analyzing the jitter of the differential signal based on the rebuilt ideal clock, and generating and outputting a jitter analysis wave according to the defined jitter analysis mode; and a storage for storing the signal file and source codes of applications executable by the jitter analyzing unit;

wherein the MDA is a clock algorithm according to the following formulas:

φ=median(X),X={X$_1$,X$_2$, . . . X$_n$},X$_i$=S$_i$-T$_i$, and $$\min \sum_{i=1}^{i=n} |S_i - \phi - T_i|.$$

2. The system according to claim 1, further comprising a display unit for displaying the jitter analysis wave.

3. The system according to claim 1, further comprising a jitter analysis interface, the jitter analysis interface comprising:

a wave displaying area for displaying the jitter analyzing wave;

a command controlling area for users to select the signal file and control the process of the jitter analysis;

a jitter analysis mode defining area for the users to define the jitter analysis mode and set corresponding mode analysis parameters; and a parameters displaying area for displaying the set parameters of the jitter analysis mode.

4. The system according to claim 1, wherein the jitter analyzing unit comprises a file identifying module for obtaining the signal file and identifying the type of the signal file.

5. The system according to claim 1, wherein the jitter analyzing unit comprises a file identifying module for obtaining the signal file and identifying the type of the signal file.

6. The system according to claim 1, wherein the jitter analyzing unit comprises a clock rebuilding module for obtaining the differential signal from the signal file and rebuilding the ideal clock according to the differential signal.

7. The system according to claim 1, wherein the jitter analyzing unit comprises a jitter analysis module for calculating and analyzing the jitter of the differential signal based on the ideal clock and the defined analysis mode.

8. The system according to claim 1, wherein the jitter analyzing unit comprises a wave generating module for generating and outputting the jitter analyzing wave according to the defined jitter analysis mode.

9. The system according to claim 1, wherein "$X_i$" represents the time difference between the time value which the voltage of the differential signal is zero and the nearest positive edge of the ideal clock; "$S_i$" represents the time value which the voltage of the differential signal is zero; "$T_i$" represents the time value of zero voltage at the nearest positive edge of the ideal clock; and "median(x)" is a median function for calculating a median of the setting function $X=\{X_1, X_2, \ldots X_n\}$.

10. A computerized method for analyzing jitter of a signal, comprising steps of:
    obtaining a signal file from a storage using a jitter analyzing unit installed in a computer, and using the jitter analyzing unit for:
    identifying a type of the signal file;
    defining a jitter analysis mode;
    obtaining an n-bit differential signal from the obtained signal file;
    rebuilding an ideal clock based on the differential signal by means of performing a Minimum Deviation Algorithm (MDA), wherein the MDA is a clock algorithm according to the following formulas:

$\phi=\mathrm{median}(X), X=\{X_1, X_2, \ldots X_n\}, X_i=S_i-T_i$, and $$\min \sum_{i=1}^{i=n} |S_i - \phi - T_i|;$$

calculating and analyzing jitter of the differential signal according to the ideal clock;
    generating a jitter analysis wave according to the defined jitter analysis mode; and
    outputting and displaying the jitter analysis wave on a display unit connected to the computer.

11. The method according to claim 10, wherein the jitter analysis mode is any one of a phase jitter mode, a periodic jitter mode, and a cycle jitter mode.

12. The method according to claim 10, wherein the step of calculating and analyzing jitter of the differential signal according to the ideal clock comprises the steps of:
    selecting a window-width by means of utilizing the MDA;
    calculating a phase and period of the ideal clock by means of utilizing the MDA; and
    analyzing the jitter of the differential signal according to the phase and period of the ideal clock.

13. The method according to claim 10, wherein "$X_i$" represents the time difference between the time value which the voltage of the differential signal is zero and the nearest positive edge of the ideal clock; "$S_i$" represents the time value which the voltage of the differential signal is zero; "$T_i$" represents the time value of zero voltage at the nearest positive edge of the ideal clock; and "median(x)" is a median function for calculating a median of the setting function $X=\{X_1, X_2, \ldots X_n\}$.

14. The method according to claim 10, wherein the jitter analysis wave comprises an eye-diagram, a bathtub curve, a histogram, a time domain jitter, and a frequency domain jitter.

15. A method for analyzing jitter of a signal, comprising steps of:
    obtaining a signal file from a storage using a jitter analyzing unit installed in a computer, and using the jitter analyzing unit to:
    identify said signal file selected from measurement result signal files and simulation result signal files, and modify said signal file to be analyzable when said signal file is a simulation result signal file;
    select a jitter analysis mode predefined for analyzing jitter;
    rebuild an ideal clock comparable to said signal file based on said signal file and said selected jitter analysis mode by means of Minimum Deviation Algorithm (MDA), wherein the MDA is a clock algorithm according to the following formulas:

$\phi=\mathrm{median}(X), X=\{X_1, X_2, \ldots X_n\}, X_i=S_i-T_i$, and $$\min \sum_{i=1}^{i=n} |S_i - \phi - T_i|;$$

calculate jitter of said signal file based on said selected jitter analysis mode;
    output jitter analysis results based on said selected jitter analysis mode and said calculated jitter; and
    display said jitter analysis results on a display unit connected to said computer.

16. The method according to claim 15, wherein signal nodes are selectively extracted from said signal file for analyzing when said signal file is identified as a simulation result signal file in said identifying and modifying step.

17. The method according to claim 15, wherein "$X_i$" represents the time difference between the time value which the voltage of the differential signal is zero and the nearest positive edge of the ideal clock; "$S_i$" represents the time value which the voltage of the differential signal is zero; "$T_i$" represents the time value of zero voltage at the nearest positive edge of the ideal clock; and "median(x)" is a median function for calculating a median of the setting function $X=\{X_1, X_2, \ldots X_n\}$.

* * * * *

UNITED STATES PATENT AND TRADEMARK OFFICE
CERTIFICATE OF CORRECTION

PATENT NO.      : 7,634,371 B2                                    Page 1 of 1
APPLICATION NO. : 11/212338
DATED           : December 15, 2009
INVENTOR(S)     : Li et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1098 days.

Signed and Sealed this

Ninth Day of November, 2010

David J. Kappos
*Director of the United States Patent and Trademark Office*